United States Patent [19]

Dennis

[11] Patent Number: 4,766,478

[45] Date of Patent: Aug. 23, 1988

[54] LEAD FRAME FOR SEMI-CONDUCTOR DEVICE AND PROCESS OF CONNECTING SAME

[76] Inventor: Richard K. Dennis, 295 Sipe Rd., Box 518A, York Haven, Pa. 17370

[21] Appl. No.: 10,297

[22] Filed: Feb. 2, 1987

Related U.S. Application Data

[63] Continuation-in-part of Ser. No. 902,798, Sep. 2, 1986.

[51] Int. Cl.⁴ ............................................. H01L 23/48
[52] U.S. Cl. ........................................ 357/70; 357/69; 357/68; 357/79; 357/72
[58] Field of Search ..................... 357/70, 69, 68, 79, 357/72

[56] References Cited

U.S. PATENT DOCUMENTS

| | | | |
|---|---|---|---|
| 3,838,984 | 10/1974 | Crane et al. | 357/70 X |
| 4,109,096 | 8/1978 | Dehaine | 357/69 X |
| 4,196,959 | 4/1980 | Chesemore et al. | 357/70 X |
| 4,234,666 | 11/1980 | Gursky | 357/69 X |
| 4,293,890 | 10/1981 | Varsane | 361/310 |
| 4,323,293 | 4/1982 | De Rouen et al. | 357/70 X |
| 4,496,965 | 1/1985 | Orcutt et al. | 357/70 |

Primary Examiner—Andrew J. James
Assistant Examiner—William A. Mintel
Attorney, Agent, or Firm—C. Hercus Just

[57] ABSTRACT

A lead frame having opposite rows of leads to be connected to the edges of a semi-conductor device and heads on one end of said leads provided with similar angularly related legs between which the edges of the device are received for ultimate soldered connection thereto, the leads and corresponding heads respectively extending from opposite sides of an elongated supporting strip connected at the ends thereof to spaced locations on the lead frame and when the ends of the leads extending from one side of the strip are depressed from the plane of the frame, the ends of the strip where connected to the frame are twisted to extend the headed ends of the leads upwardly and thereby cause the uppermost legs of the heads of opposite rows thereof to be spaced apart a distance greater than the width of the device to be connected thereto while the ends of the rows of lowermost legs of the heads are closer together than the width of the device and receive the same for support thereon prior to the rows of leads being restored to the plane of the frame and thereby cause the opposite rows of uppermost legs to be extended toward each other and overlie the edges of the device and in conjunction with the lowermost legs of the heads secure the device between the legs of the opposite rows of heads.

5 Claims, 1 Drawing Sheet

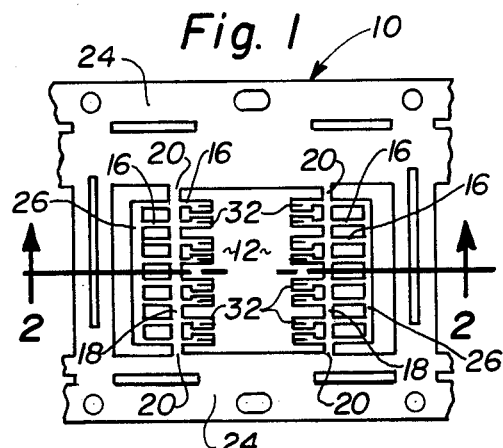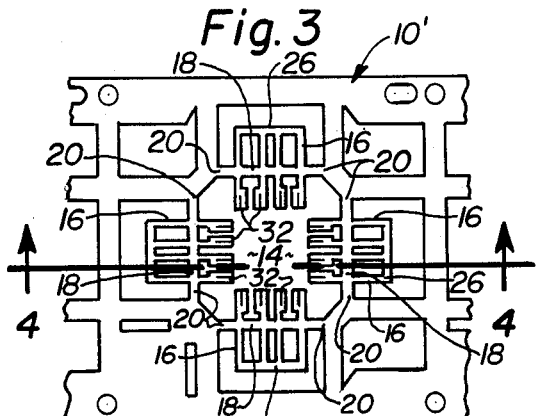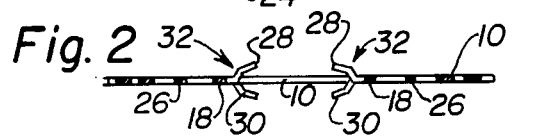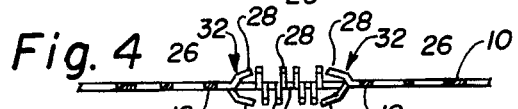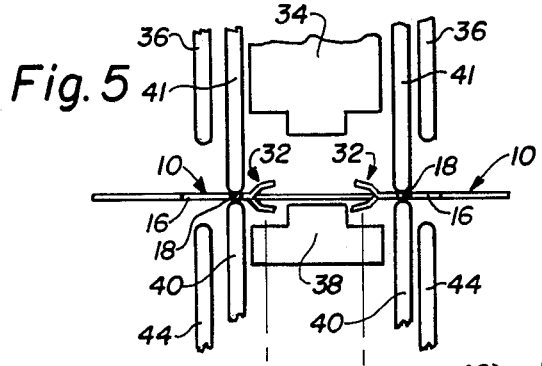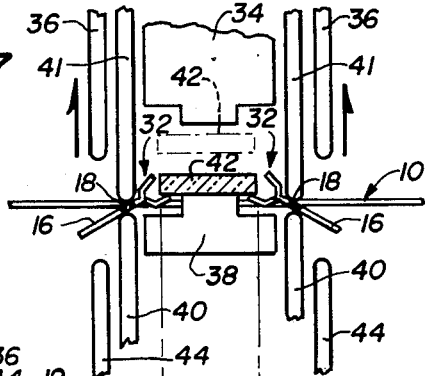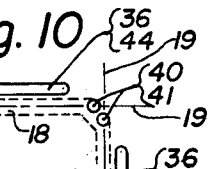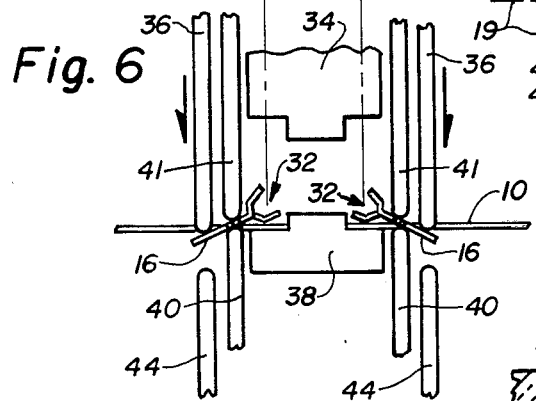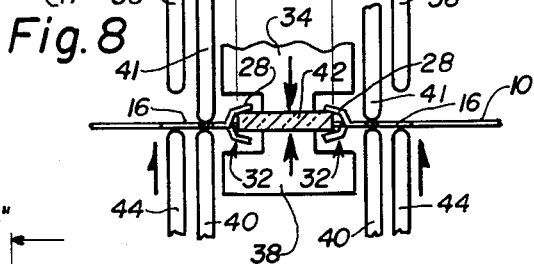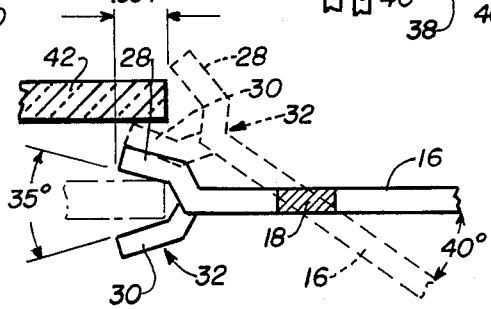

LEAD FRAME FOR SEMI-CONDUCTOR DEVICE AND PROCESS OF CONNECTING SAME

This application is a continuation-in-part of prior application, Ser. No. 902,798, filed Sept. 2, 1986.

BACKGROUND OF THE INVENTION

This invention relates to a lead frame having rows of leads thereon upon one end of which slit heads are mounted in opposing rows or in a pair of transversely disposed pairs of rows of heads between which a space is provided for the reception of a semi-conductor device which comprises a suitable substrate upon which electronic circuits are imprinted either upon one or both faces thereof and to which leads are to be connected. When the semi-conductor devices are positioned between the heads on said rows of leads, soldering of the heads to the ends of the circuits on the substrate is effected.

Various problems have been encountered incident to the positioning of semi-conductor devices between opposite rows of leads and heads thereon and various attempts to solve said problems comprise the subject matter of the following patents:

U.S. Pat. No. 3,838,984—Crane et al, Oct. 1, 1974
U.S. Pat. No. 4,109,096—Dehaine, Aug. 22, 1978
U.S. Pat. No. 4,196,959—Chesemore et al, Apr. 8, 1980
U.S. Pat. No. 4,234,666—Gursky, Nov., 18, 1980
U.S. Pat. No. 4,323,293—DeRouen et al, Apr. 6, 1982
U.S. Pat. No. 4,496,965—Orcutt et al Jan. 29, 1985

The present invention also is somewhat of a counterpart of applicant's prior pending application, Ser. No. 648,972, filed Sept. 10, 1984, and offers certain improvements thereover, without depreciating the subject matter of said prior application, as well as over the above-listed prior art, details of which are set forth below:

It is customary in furnishing lead frames to the industry requiring the same to arrange the same in strip form of indefinite length. The strips are formed from relatively thin sheet metal, one common form now employed being copper of a certain thickness and flexibility. In stamping metal of this type, such as to slit the heads on the end of leads and bend the legs of the heads apart, for example, to achieve a certain spacing between such legs, it is necessary to bend the legs apart a slightly greater distance than is desired in order that the springiness of the material will tend to return the legs at least slightly toward the original position thereof and features of this type have to be taken into consideration incident to designing final products.

SUMMARY OF THE INVENTION

It is among the principal objects of the present invention to stamp a strip of the type of metal conventionally used, such as certain types of copper, to provide a series of lead frame units connected in strip form and each frame unit having rows of leads upon one end of which a head is formed and said rows of leads are provided in spaced opposite relationship within said frame units of the metal, and in many instances, two pairs of opposed rows of said connected leads and heads are provided in the frame, at a right angle to each other, in such manner that a substantially square space is formed between the outer ends of the heads of all of the rows thereof to receive therebetween a semi-conductor device which ultimately is to be connected to all of the rows of heads and subsequently soldered thereto.

Initially, the ends of the legs of the heads which are in opposition to each other are spaced apart a distance slightly less than the transverse dimension of the semi-conductor device to be supported therebetween and the object of the present invention is to bend the legs of each head into angular disposition to each other to form substantially a Y configuration and parallel rows of the leads and corresponding heads which are longitudinally arranged therewith are supported by a transverse supporting strip of the same metal which connects the rows of leads together, preferably intermediately of the ends thereof, and the opposite ends of said strip respectively are connected to certain spaced portions of the lead frame units.

By this arrangement, it has been found that by depressing the outer ends of the rows of leads, which are opposite the headed ends, while the ends of the supporting strip are supported in clamped manner upon a suitable device, the opposite ends of said supporting strip are twisted similarly about the axis of the strip and all of the leads, in a common plane, are disposed at a desired angle to the plane of the lead frame. As a result of such twisting of the ends of the strip to position the leads at said angle, the heads thereof are elevated sufficiently above the plane of the lead frame that the upper legs of each head in opposing rows thereof are spaced apart a distance at least slightly greater than the transverse dimension of a semi-conductor device to be supported between said heads, while the lower legs of each of the opposed rows of heads are spaced apart a distance less than said transverse dimension of such device, and thus, form a support therefor. Accordingly, when the leads and heads of opposite rows thereof subsequently are restored to the plane of the lead frame units, the outer ends of the upper legs of the opposite rows of heads are extended toward each other to the initial positions thereof in which they overlie the edges of the device and the lower legs underlie the device in a manner that they may be connected to terminals of printed circuits upon said device, usually by employing solder.

Another object of the invention is to bend the legs of the heads angularly away from the plane of the leads to which the heads are connected, preferably substantially equally in opposite directions so as to subtend an exemplary angle, such as between 30° and 40°, with a preferred optimum angle of 35°, depending upon the thickness of the semi-conductor devices to be received between the legs of the heads.

Still another object of the invention is to depress the ends of the rows of leads opposite the headed ends, below the plane of the lead units, and correspondingly raise the headed ends connected thereto at an angle of approximately 40°, for example, to the plane of the lead frame, depending upon the extent of space desired between the ends of the upper legs of the opposite rows thereof for reception of a semi-conductor device between the spaced rows of upper legs. The greater the angle of elevation, the greater will be the space between the ends of the upper legs of the opposite rows of the heads and the angle between the legs of the heads also is a factor controlling the space between the ends of the upper legs of the opposite rows of heads and such angle also must be adequate to accommodate readily the thickness of the semi-conductor devices to be positioned between the opposite rows of such heads but in no circumstances is the space between the ends of the lower legs of opposite rows less than the transverse dimension of the device to be supported between the rows of heads, regardless of the angle between the legs or the angle to which the heads are elevated relative to the lead frame units.

One further object of the invention is to firmly clamp portions of the lead frame between opposite clamping members at least in areas adjacent the opposite ends of the supporting strip and thereby render the twisting of said ends of said strip more efficient by deflecting members engaging and depressing below the plane of the lead frame units the end portions of the leads which are opposite the headed ends of the leads and simultaneously elevate the headed ends of the leads above the plane of the lead frame units.

Still another object of the invention is subsequently to restore the rows of leads and heads to the original plane of the frame units, with the semi-conductor device securely anchored between the opposite rows of heads, whereby opposite surfaces of said device are available respectively to contain separate circuitry connectable selectively to said heads and leads of said rows thereof.

Details of the foregoing objects and of the invention are set forth in the following specification and illustrated in the accompanying drawings comprising a part thereof.

BRIEF DESCRIPTION OF THE DRAWINGS

FIG. 1 is a fragmentary frame separated from a strip thereof and showing a pair of opposed rows of leads and heads spaced apart to receive a semi-conductor device therebetween.

FIG. 2 is a fragmentary sectional view taken on the line 2—2 of FIG. 1.

FIG. 3 is a fragmentary section showing a lead frame unit in which two pairs of spaced rows of leads and heads are arranged in 90° relationship to each other and the ends of said heads are all spaced in such manner as to define the space in which a semiconductor device is to be positioned and supported.

FIG. 4 is a fragmentary sectional view taken on the line 4—4 of FIG. 3.

FIG. 5 is the first of a series of steps illustrating a method of manipulating the lead frame units to effectively and quickly mount the semi-conductor devices between opposite rows of heads attached to leads, FIG. 5 illustrating the initial position in which a frame unit is clamped between opposed pressing members adjacent opposite ends of the supporting strips.

FIG. 6 illustrates the next step of the process in which the ends of the leads opposite the headed ends have been depressed by vertically movable deflecting members to dispose the same at a downwardly and outwardly extending angle at opposite sides of the frame, thereby spreading the ends of the upper legs of the heads a greater distance than initially, while the lower legs are not additionally spaced and are substantially adjacent supporting means to receive a semi-conductor device.

FIG. 7 is a view similar to FIG. 6 but in which a semiconductor device is shown positioned between an opposite pair of heads and the means by which the leads were depressed has been moved to inoperative position.

FIG. 8 illustrates the next step in the method wherein additional vertically movable presser members are moved upwardly to engage the ends of the leads opposite the headed ends to restore the previously depressed leads to the original plane thereof and thereby dispose the upper legs of the heads in overlying position with respect to the semi-conductor device and cooperate with the lower legs of the heads so as to dispose the heads and device in position for soldering.

FIG. 9 is an enlarged fragmentary detail view showing substantially the preferred shape of the legs of the heads attached to the sectionally shown supporting strip, intermediately of the ends of the leads which have been foreshortened to accommodate the same to the sheet and in which, in full lines, an exemplary position of a fragmentary portion of a lead frame is shown disposed between the spaced legs of the heads, while in phantom position, the head and lead are shown at an angle to the original plane thereof and in which the outer end of the upper leg of the head has been moved laterally an illustrated distance.

FIG. 10 is a diagrammatic plan view illustrating the relative positions of clamping members and also deflecting and presser members with respect to each other and the axes of twist of the opposite ends of the supporting strips for the leads.

DETAILED DESCRIPTION OF THE PREFERRED EMBODIMENT OF THE INVENTION

Referring to FIG. 1, fragmentary lead frame unit 10 is illustrated, it being understood that an indeterminate number of such units will be included in actual use in a strip thereof. In FIG. 1, only a pair of opposed rows of heads and leads of a unit are formed to provide a space 12 between the rows of heads to accommodate a semiconductor device therein.

Referring to FIG. 3, a lead frame unit 10' is shown as a fragmentary member of indeterminate length thereof in a strip and in which two pairs of opposed rows of leads and heads are shown to provide a substantially square opening 14 to receive a semiconductor device. In FIG. 1, the leads 16 are shown connected to a supporting strip 18, the opposite ends 20 of which are connected to the opposite frame members 22 and 24. Further, it will be seen that the outer ends of the leads 16 are commonly connected by an elongated member 26.

Referring to FIG. 2, it will be seen that the heads 32, as viewed in FIG. 1, are slit longitudinally to comprise pairs of upper legs 28 and lower legs 30 which, as viewed more specifically in FIG. 9, are shown to be disposed by an exemplary angle of 35° therebetween, but it is to be understood that this preferably is the optimum angle and a range, such as between 30° and 40°, is operable, depending upon the thickness of the devices to be engaged thereby.

Referring to FIG. 3, the principal difference over FIG. 1 being that two opposite pairs of leads and heads are shown respectively at 90° to each other to form the aforementioned substantially square opening 14 between the outer ends of the rows of heads 32.

Referring to FIG. 4 with respect to FIG. 3, it will be seen that the heads 32 of the upper and lower rows of the heads 32 are spaced apart as are the left and righthand rows of heads 32. In the initial position of all of the heads shown in FIGS. 1-4, the ends of the legs of all of the rows of heads initially are spaced apart a distance slightly less than the transverse dimension of a semiconductor device to be mounted between said rows of heads. A description of the method by which the semiconductor devices are mounted between said rows of heads is illustrated in FIGS. 5-8, details of which are as follows:

In FIG. 5, it will be understood that while only a single opposed pair of heads is illustrated, they are representative of rows of such heads, as well as the leads 16 to which they are connected. The supporting strips 18 also comprise pivotal axis 19, see FIG. 10, about which the rows of leads 16 are moved by depressing the outer ends of the leads, which are opposite headed ends, to the position shown in FIG. 6 in diagrammatic manner. There is an upper member 34 adapted to facilitate the placing of a semi-conductor device between opposite rows of heads 32 as described hereinafter. Also, fragmentarily illustrated at opposite sides of the member 34 are narrow deflecting members 36 which actually engage the ends of the rows of leads 16 opposite the headed ends to deflect the full length of the leads about the axis 19 of the supporting strip 18, due to only the opposite ends 20 of the supporting strips 18 respectively being twisted with respect to the main frame member 10. In effect, the portion of the strips 18 to which the leads are connected may be said to be rotated about the axis of the strips 18 through a limited predetermined segment of rotation. The narrow deflecting members 36 may be moved by any suitable power means in an appropriate cycle with respect to the lower repositioning members 44.

A lower anvil 38 also is disposed between fixed supporting members 40, the upper ends of which engage and support areas of the lead frame immediately adjacent the ends 20 of supporting strips 18 and upper clamping members 41 are movable by suitable power means, not shown, to engage upper surface areas of lead frame 10 in vertical alignment with the areas engaged by lower supporting members 40. Thus, with the lead frame areas immediately adjacent the ends 20 of supporting strip 18 firmly clamped, when the aforementioned outer ends of the leads 16 are engaged by the upper deflecting members 36 in descending movement of predetermined amount, the ends 20 of strip 18 are simultaneously similarly twisted to dispose the full length of the leads 16 at an exemplary angle to the plane of lead frame 10, as shown in FIG. 6.

In FIG. 6, as a result of the angular disposition of the leads 16, described above, it will be seen that the distance between the ends of the upper legs 28 of the heads 32 in opposite rows thereof is greater than the transverse dimension of the exemplary semi-conductor device 42, as shown in FIGS. 7-9. Also, as shown particularly in FIG. 7, the outer ends of the lower legs of the heads 32 are always spaced apart a distance less than the transverse dimension of the semi-conductor device 42, and thus, in addition to the lower anvil 38, comprise a support for the semi-conductor device 42.

The final step in the operation of the method is illustrated in FIG. 8 and in which it will be seen that, while the spaced end portions of the lead frame immediately adjacent the opposite ends 20 of the supporting strips 18 are firmly clamped between members 40 and 41, when the semi-conductor device 42 is positioned by suitable operation anvil of member 38, the lower legs 30 of the heads 32 and the anvil member 38 are moved downwardly coincidentally while the repositioning members 44 are moved upwardly, as shown by the arrows in FIG. 8, and member 34 is depressed, such upward movement of members 44 restoring the leads 16 and heads 32 to the original position thereof within the plane of the lead frame unit 10, such as shown in FIGS. 5 and 8, with the opposite edges of the semi-conductor device 42 positioned between the opposite rows of heads 32 and accurately in position to be soldered to the circuits disposed on one or both faces of such device. When this has been completed, all of the movable members referred to above are moved to the initial positions thereof, such as shown in FIGS. 5 and 8 and the strip of lead frame is advanced in the forming device to bring the next lead frame unit thereof into position with the apparatus shown in FIG. 5, and the above-described method is repeated.

As shown in FIGS. 5-8, supporting strip 18 is indicated between the clamping ends of upper and lower clamping and support members 40 and 41. Actually, the members 40 and 41 engage portions of the lead frame 10 which are immediately adjacent the opposite ends 20 of the supporting strips 18, or possible small portions of said opposite ends, and it is only the end portions 20 which are twisted to rotate the portions of strips 18 to which the leads are connected and thereby dispose the leads 16 and heads 32 on one end thereof at the angular positions shown in FIGS. 6 and 7 relative to the plane of the lead frame unit 10.

For purposes of more clearly illustrating and defining to a more definite extent than illustrated in FIGS. 5-8, FIG. 9 shows a single exemplary head 32 with the upper and lower legs 28 and 30 being illustrated initially, in full lines, within the plane of the main frame 10, and when the full length of leads 16 has been transposed from the plane of the lead frame through an angle determined by the thickness of the semi-conductor device to be supported between the heads 32, the heads 32 are transposed to the phantom position shown in FIG. 9, wherein it will be seen clearly that there is a marked difference in lateral position, with respect to the vertical plane of the outer ends of the upper legs 28 of the heads 32, the drawing illustrating solely as an example for illustration, an exemplary preferred distance of 0.034 inches, which when considered in conjunction with the head on an opposite row thereof, not shown, the distance between the upper legs of the opposed rows of heads will be increased to the exemplary extent of approximately 0.068 inches. This exemplary distance is provided as being reasonable to accommodate a limited variation in the transverse dimensions of semi-conductor devices to be connected to the leads therefor in accordance with the present invention.

In the designing and constructing of equipment to accommodate semi-conductor devices of a particular customer, the thickness of the devices is one important factor, especially in regard to the angle between the legs of the heads. Another important factor is the transverse dimension of the devices to be positioned between the ends of the heads of opposite rows thereof, whether a single pair of parallel rows, or two pairs of parallel rows at 90° respectively to each other. Having these critical factors in mind, the angle between the legs of the heads is determined so that the thickness of the devices can readily be accommodated, and the angle to which the leads are transformed from the plane of the lead frame, by twisting the ends of the supporting strip of the leads, is determined to be sure the increased space between the upper legs of opposite rows of the heads is adequate to receive the devices between the upper legs of said rows of heads while the distance between the ends of the lower legs of the heads is not decreased and remains less than the transverse dimension of the devices to be supported by said lower legs of the heads.

Another important feature of the invention is that the terminal portions of legs 28 and 30 of heads 32 are straight and angularly disposed to each other at the exemplary angles described above so that there is no frictional clamping or gripping of the device 42 by the legs 28 and 30, as is clearly shown in FIG. 9, especially in full lines. Therefore, it will be understood that the illustrative dimensions included above are given for a certain specific thickness and transverse dimension of an exemplary device.

After the opposite heads 32 have been moved to the phantom position shown in FIG. 9, and the semi-conductor device 42 has been mounted between opposite rows of said heads, the heads 32 are restored to the full line position, shown in FIG. 9, by elevating the ends of the leads opposite the headed ends, and in which restored position the upper legs 28 of the heads 32 overlie the edges of the semi-conductor device 42 sufficiently to capture the same between opposite pairs of said heads for subsequent operations, such as connection by solder between the heads and the device supported thereby. The opposite surfaces of said device respectively also are available to support separate circuitry connectable selectively to said leads.

It will be understood that as the semi-conductor device 42 is positioned upon anvil 38, as shown in FIG. 7 from the phantom position shown therein, and lower repositioning members 44 are elevated, the leads 16 will be restored to the plane of lead frame 10 as illustrated in FIG. 8. Also, the lower anvil 38 automatically is coincidentally lowered to provide adequate support for the device 42 as the heads 32 are lowered to cause the upper legs 28 of the heads 32 to be moved into overlying position relative to the edges of the device 42. Upper member 34 also preferably engages device 42 from above to insure desired positioning of it between the opposing heads 32 at opposite edges of the device.

To facilitate understanding of the relative positions of the various support, clamping, deflecting and repositioning members 40, 41, 36 and 44, reference is directed to FIG. 10, which is a diagrammatic plan view showing in full lines the lower and upper members 40 and 41 which clamp the portions of the lead frame adjacent the ends 20 of supporting strips 18, which are shown in phantom dotted lines and longitudinally through which the axes 19 are shown extended to indicate the location of the twists in the outer end portions 20 of supporting strips 20. The superimposed deflecting and repositioning members 36 and 44 are shown as being narrow and of a length corresponding to the transverse extent of the rows of leads connected to each supporting member 18.

From the foregoing, it will be seen that the present invention provides adequate apparatus and a substantially fool-proof method of operating the same to connect a semi-conductor device between opposite rows of heads simply by twisting the ends 20 of the longitudinally extending supporting strips 18, which connect and support the leads and heads, through an exemplary angle of approximately 40°, the extent of which, however, is controlled by thickness and transverse dimensions of semi-conductor devices to be positioned between the opposite rows of heads, and said angle is operable to space apart the upper legs of the opposite rows of heads a distance adequate to receive between such spaced upper legs the semi-conductor device 42, within a limited range of tolerance of transverse dimensions, and provide ultimate adequate support of the semi-conductor device 42 between the opposite pairs of heads of the rows of leads to be connected to said device in accordance with the procedures described above and illustrated in the drawings. The angle between the legs of the heads also is selected to be adequate suitably to receive the edges of the devices within a limited tolerance variation.

The foregoing description illustrates preferred embodiments of the invention. However, concepts employed may, based upon such description, be employed in other embodiments without departing from the scope of the invention. Accordingly, the following claims are intended to protect the invention broadly, as well as in the specific forms shown herein.

I claim:

1. A lead frame for supporting a semi-conductor device comprising a metallic planar frame unit having a central opening and at least a pair of opposite rows of flat leads having heads on one end, each of said heads comprising a pair of similar substantially straight upper and lower terminal leg portions extending from said leads which leg portions respectively are bent substantially equally in opposite directions from the plane of said leads in a forked manner, and said rows of flat leads are connected integrally intermediately of the opposite ends thereof to a flat elongated connecting strip and the ends of all connecting strips surrounding said central opening being integrally connected, said connecting strips being parallel to each other at opposite sides of said central opening and terminal ends of the legs of the heads in opposite parallel rows thereof are spaced apart a distance less than the transverse dimension of a semi-conductor device to be supported by said opposite rows of heads, the opposite ends of said connecting strips are also connected to spaced portions of said lead frame unit and the intermediate portion of said strips between said ends when rotated about the axis of said strips in one direction sufficiently transpose the plane of the flat leads at an angle to the plane of said frame and thereby elevate the heads of said leads above the plane of said frame to space apart the ends of the upper legs of said heads in opposite rows thereof a distance at least slightly greater than the transverse dimension of a semi-conductor device to be supported between said opposite rows of heads and the lower legs of said opposite rows of heads extending toward each other a distance no less than when in the plane of said lead frame, whereby a device is received between said opposite rows of upper legs and is positioned upon said opposite rows of lower legs and said connecting strips and flat leads are then rotated to restore the same to the plane of said lead frame and said upper legs of said heads overlie said device and the lower legs of said heads underlie said device for support and thereby the device is secured between the inner ends of the straight terminal leg portions of said opposite rows of heads for sole independent support thereby.

2. A planar lead frame unit of flexible metal comprising a substantially flat geometric pattern of opposed rows of similar flat leads having open containment heads respectively on one end of a row of parallel leads in a common plane, portions of the leads of said rows thereof extending in opposite directions from a narrow flat supporting strip connected at the opposite ends thereof to spaced portions of a substantially flat lead frame and the ends of all supporting strips being integrally connected, one end of said leads each having heads comprising a pair of upper and lower legs bent respectively substantially equally in opposite directions from said common plane to comprise a substantially Y-configuration with straight angularly related terminal end portions, and the ends of the legs of opposite rows of said heads are spaced apart a distance less than the width of a semi-conductor device which is supported therebetween and the ends of said rows of leads opposite those ends with the heads thereon when depressed a predetermined distance in one direction from said common plane about the axis of said strip thereby twist the opposite ends of said supporting strip relative to said frame and cause rotation of the portion of said strip between the opposite ends thereof and correspondingly elevate said heads of said leads above the plane of said lead frame and thereby space apart opposite rows of the upper legs of said heads a distance through which a semiconductor device passes and the ends of the lower legs of each opposite row of heads thereby being closer together than the width of said device and thereby supports said device between said opposite rows of said heads, and said leads are elevated from a depressed position by reversely rotating said portion of said supporting strip which connects said leads, whereby said leads and heads thereon are restored to said plane of said lead frame and the ends of said upper legs of said heads in said opposite rows are extended toward each other to their original position and thereby overlie said device while the lower legs of said heads underlie said device and secure it between said opposite rows of heads to comprise the sole support for said devices within said lead.

3. The lead frame according to claim 2 in which said legs of said heads comprise portions of a flat head which is slit longitudinally a predetermined distance inward from the outer end of said head and said legs are bent in opposite and substantially equal angles from the initial plane of said heads and the terminal portions of said legs being straight and subtending therebetween an angle of between 30° and 40°.

4. The lead frame according to claim 3 in which the optimum angle between the legs of said heads is substantially 35°.

5. The lead frame unit according to claim 2 further characterized by the heads on opposed rows of leads being on opposite sides of an opening in said unit and in which opening said semi-conductor device is disposed when supported between said opposed rows of leads and heads, whereby opposite surfaces of said device are available to contain separate circuitry respectively connectable to the upper and lower legs of said heads on the leads in said opposed rows thereof.

* * * * *